United States Patent [19]
Nakasuji et al.

[11] Patent Number: 5,747,819
[45] Date of Patent: May 5, 1998

[54] CHARGED PARTICLE BEAM TRANSFER DEVICE EXHIBITING LOW ABERRATION

[75] Inventors: Mamoru Nakasuji, Yokohama; Hiroyasu Simizu, Kawasaki, both of Japan

[73] Assignee: Nikon Corporation, Tokyo, Japan

[21] Appl. No.: 739,816

[22] Filed: Oct. 30, 1996

[30] Foreign Application Priority Data

Nov. 1, 1995 [JP] Japan .................................. 7-285118

[51] Int. Cl.$^6$ ............................................. H01J 37/317
[52] U.S. Cl. ............................... 250/492.23; 250/398
[58] Field of Search ........................ 250/492.23, 492.21, 250/492.3, 398

[56] References Cited

U.S. PATENT DOCUMENTS 5,466,904  11/1995  Pfeiffer et al. ...................... 219/121.25
5,545,902  8/1996  Pfeiffer et al. ...................... 250/492.23
5,635,719  6/1997  Petric ................................... 250/492.23

*Primary Examiner*—Jack I. Berman
*Attorney, Agent, or Firm*—Klarquist Sparkman Campbell Leigh & Whinston

[57] ABSTRACT

A charged particle beam transfer device exhibiting a low level of aberration is disclosed. The device comprises a first deflector for deflecting a charged particle beam, that has passed through a subfield on a reticle, such that the beam passes through the optical axis, or at least the center, of a projection lens. To such end, the first deflector deflects the beam a first angle of deflection relative to an optical axis of the device. The device also comprises a second deflector to deflect the beam, after having passed through the projection lens, at a second angle of deflection that is opposite the first angle of deflection. Thus, the beam is guided to a region on a substrate surface corresponding to the particular subfield on the reticle.

20 Claims, 5 Drawing Sheets

CHARGED PARTICLE BEAM TRANSFER DEVICE EXHIBITING LOW ABERRATION

FIELD OF THE INVENTION

This invention pertains to "charged-particle-beam transfer devices," specifically apparatus for transferring an image from a reticle or mask to a substrate (as in lithography) using a beam of charged particles rather than a beam of light.

BACKGROUND OF THE INVENTION

A charged-particle-beam transfer device (CPBTD) is conventionally used for reproducing a pattern, defined on a mask or reticle, on a substrate surface by passing a charged particle beam through the pattern so as to form an image of the pattern on the substrate surface. The pattern is usually divided into multiple subfields on the reticle and transferred to the substrate surface subfield-by-subfield. The charged particle beam is suitably deflected and focused electromagnetically as it propagates from a source, through the reticle and to the substrate surface. In passing from the reticle to the substrate surface, the beam passes through a "projection lens." Typically, the reticle, substrate and at least some of the lenses are arranged on an optical axis of the CPBTD.

When transferring a subfield that is located a substantial lateral distance away from the optical axis, the resulting image on the substrate can be distorted due to aberrations arising in the beam-focusing optics, especially off-axis aberrations. In order to decrease this image distortion, CPBTDs have been proposed that incorporate either or both the following:

(a) MOL (Moving Objective Lens) systems or VAL (Variable Axis Lens) systems or PREVAIL (Projection Exposure with Variable Axis Immersion Lenses) systems; or (b) SMD (Symmetric Magnetic Doublet) systems and the like.

With any of the approaches listed in (a), above, the axis of a lens is appropriately shifted, using a deflector, in the trajectory of the charged particle beam. E.g., whenever the charged particle beam passes through a subfield of the reticle that is not located on the optical axis, a lens operable to refract the particle beam is laterally shifted so that the charged particle beam actually or nearly passes along the axis of the lens. In such a scheme, the axis of the lens is shifted each time the particle beam passes through a substantially off-axis reticle subfield.

Certain aspects of a conventional CPBTD are depicted in FIG. 6, which shows components arranged on an optical axis RX, including a projection lens 3, a reticle 6, a substrate surface 10, and a "crossover" CO. The crossover CO is defined as a point on the optical axis X that subdivides the distance between the reticle 6 and the substrate surface 10 into M:1 ($1 \leq M < 20$), where 1/M is the reduction ratio of the CPBTD. The projection lens 3 comprises a pair of electromagnetic lenses 30, 31 axially situated on opposing sides of the crossover CO. The first electromagnetic lens 30 has a principal plane at the location indicated by the transverse line 30a; and the second electromagnetic lens 31 has a principal plane at the location indicated by the transverse line 31a. The first electromagnetic lens 30 has magnetic poles 301, 302; and the second electromagnetic lens 31 has magnetic poles 311, 312.

The electromagnetic lenses 30, 31 satisfy the following expressions pertaining to symmetrical magnet doublets:

$$LM1 = LC1; \quad LW2 = LC2 \tag{1}$$

$$R1/r1 = R2/r2 = M \tag{2}$$

$$A1/a1 = A2/a2 = M \tag{3}$$

wherein LM1 and LC1 are axial distances from the principal plane 30a to the reticle 6 and the crossover CO, respectively; R1 and R2 are the bore radii of the magnetic poles 301 and 302, respectively; A1 is the axial distance between the crossover CO and the crossover-side face 301a of the magnetic pole 301; A2 is the axial distance between the crossover CO and the reticle-side face 302a of the magnetic pole 302; LW2 and LC2 are axial distances from the principal plane 31a to the substrate surface 10 and the crossover CO, respectively; r1 and r2 are the bore radii of the magnetic poles 311 and 312, respectively; a1 is the axial distance from the crossover CO to the crossover-side face 311a; and a2 is the axial distance from the crossover CO to the reticle-side face 312a. The AT (ampere-turn) numbers of the electromagnetic lenses 30 and 31 are equal, but the lenses are wired to form electromagnetic fields that are opposite to each other.

Configuring CPBTDs as in (a), above, generates aberrations because the charged particle beam is deflected using deflectors. It is theoretically difficult to reduce deflection aberrations (particularly distortion). Also, the main field and subfields of the reticle that are "illuminated" by the particle beam cannot be made larger due to deflection aberrations.

On the other hand, configuring CPBTDs as in (b), above, makes it impossible to enlarge the beam semi-angle because astigmatism and field curvature are made worse.

Consequently, disadvantages of conventional CPBTDs configured as in (b), above, include an inability to perform transfers with larger beam currents, and an inability to achieve high throughput due to beam blurring due to the space-charge effect.

In view of the foregoing, an object of this invention is to provide a CPBTD exhibiting minimal aberration.

SUMMARY OF THE INVENTION

According to one aspect of the present invention, a charged particle beam transfer device is provided for transferring a pattern defined by a reticle onto a substrate surface. The device comprises the following components arranged on an optical axis: a projection lens, a first deflector situated between the projection lens and the reticle, and a second deflector situated between the projection lens and the substrate surface. The projection lens is operable to focus a particle beam, after the beam has passed through a subfield of the reticle, onto the substrate surface. The first deflector is operable to deflect the beam, after the beam has passed through the subfield of the reticle, so as to cause the beam to pass through the optical axis, or at least through the center, of the projection lens as the beam propagates toward the substrate surface. The second deflector is operable to deflect the beam, after the beam has passed through the projection lens, so as to direct the beam to a region on the substrate surface corresponding to the subfield. Passing the beam through the optical axis, or at least through the center, of the projection lens allows the transfer image, formed on the substrate surface, to exhibit minimal aberrations, including minimal field curvature and astigmatism. Furthermore, any deflection aberrations individually generated by the first and second deflectors, respectively, essentially cancel each other.

Preferably, the angle of deflection by which the first deflector bends the charged particle beam is equal but opposite to the angle of deflection by which the second deflector bends the charged particle beam.

The device also preferably comprises a condenser lens situated upstream of the reticle. The condenser lens is operable to refract the beam onto the subfield of the reticle. Further preferably, the beam propagating from the condenser lens is incident on the subfield essentially normal (i.e., parallel to the optical axis) to the surface of the reticle; in other words, the angle of incidence of the beam on the reticle is substantially zero.

Further preferably, the second deflector is operable to cause the beam to be incident on the substrate surface essentially normal (i.e., parallel to the optical axis) to the substrate surface; in other words, the angle of incidence of the beam on the substrate surface is substantially zero.

The first deflector is preferably operable to cause the charged particle beam to pass through the optical axis at a crossover as the beam propagates to the second deflector.

If the projection lens is a one-stage lens, the crossover is preferably located on the optical axis at the principal plane of the projection lens. In such an instance, (1) the first deflector preferably has a deflection center that is situated a distance L1 from the principal plane of the projection lens, (2) the second deflector preferably has a deflection center that is situated a distance L2 from the principal plane of the projection lens, and (3) the device satisfies the expression:

$$L1/L2=M$$

wherein 1/M is the reduction ratio of the projection lens.

If the projection lens is a two-stage lens, the crossover is preferably located on the optical axis at a distance that subdivides the axial distance from the reticle to the substrate surface into M:1, wherein 1/M is the reduction ratio of the projection lens. With a two-stage projection lens, the first (or reticle-side) lens preferably comprises a reticle-side magnetic pole having a bore radius R1 and a substrate-side magnetic pole having a bore radius R2; and the second (or substrate-side) lens preferably comprises a reticle-side magnetic pole having a bore radius r1 and a substrate-side magnetic pole having a bore radius r2. In such an instance, the device preferably satisfies at least one of the relationships:

$$R1/r1=M \text{ and}$$

$$R2/r2=M$$

wherein 1/M is the reduction ratio of the projection lens.

The charged particle beam can be an electron beam, ion beam, proton beam, or the like. If the beam is of electrons, the deflectors and projection lens are preferably electromagnetic. If the beam is of ions, which are heavier than electrons, the deflectors and projection lens are preferably electrostatic. Representative electromagnetic deflectors have a toroidal or saddle configuration. A representative electrostatic deflector has an multi-pole configuration, preferably with at least six electrodes.

Further preferably, the first deflector has an inside diameter D7 and an axial length L7, and the second deflector has an inside diameter D9 and an axial length L9. In such an instance, the device preferably satisfies at least one of the following relationships:

$$D7/D9=M$$

$$L7/L9=M$$

Other features and advantages of the present invention can be ascertained from the following detailed description and drawings.

DETAILED DESCRIPTION

As used herein, to "transfer" a reticle pattern means to form an image of the pattern (with an appropriate demagnification or reduction ratio) on a substrate surface by passing a charged-particle beam through the reticle for impingement on a corresponding region on the substrate surface.

In apparatus according to the present invention, the charged particles comprising the beam can be, for example, electrons, protons, ions, or other suitable particles that can be generated from a source, focused, and used to form an image of a reticle pattern on a substrate surface.

Figure 1:
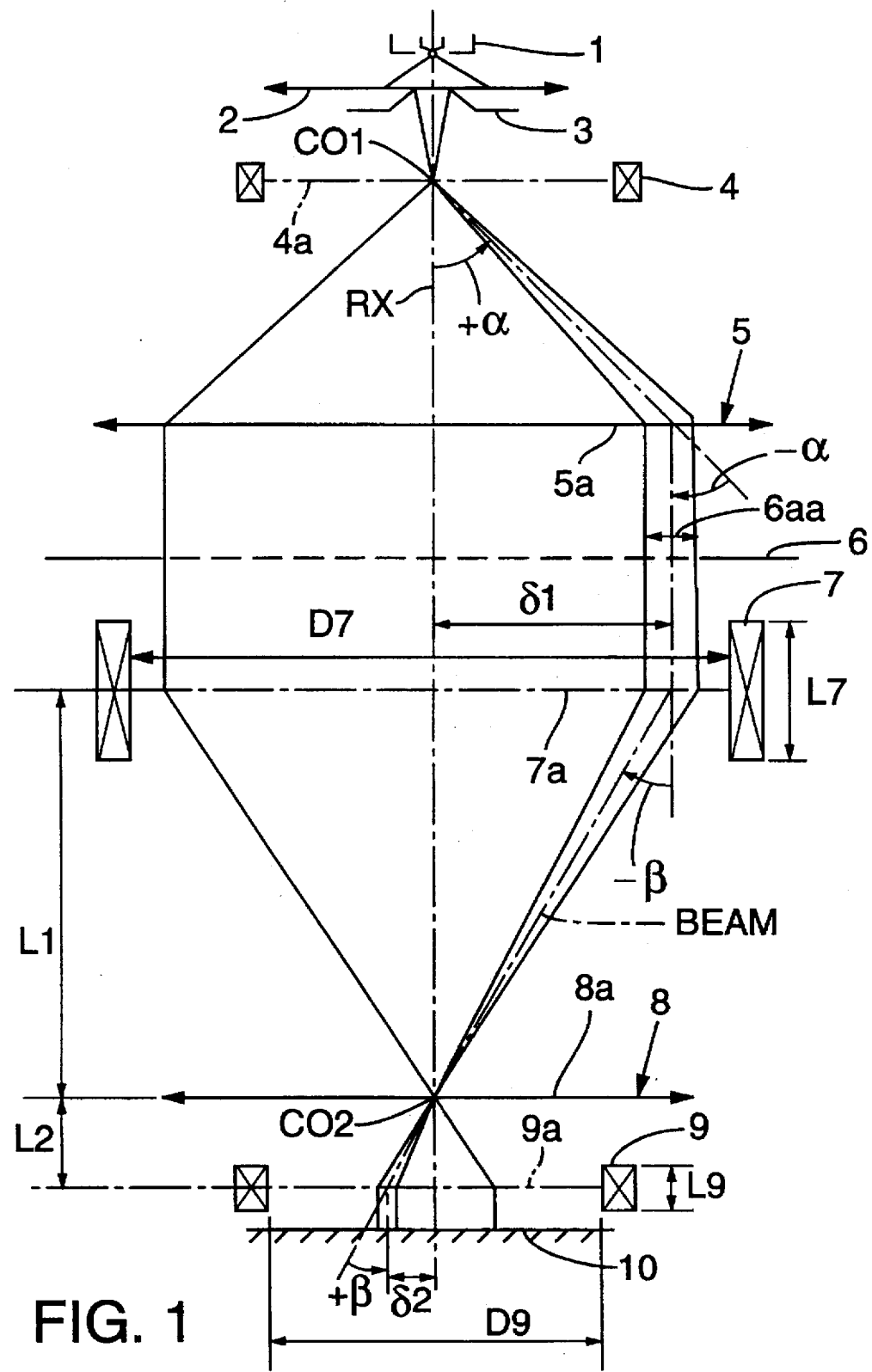
FIG. 1 is an optical diagram depicting general features of a charged particle beam transfer device (CPBTD) according to the present invention as well as certain specific features of a first example embodiment of the invention.

FIG. 1 shows certain general aspects of a CPBTD according to the present invention as well as specific aspects of a first example embodiment. The FIG. 1 embodiment utilizes an electron beam to reductively transfer a pattern on a reticle 6 to a substrate surface 10.

FIG. 1 shows the following components arranged on an optical axis RX: a charged-particle-beam source 1 (such as an electron gun for generating electrons); a first condenser lens 2 operable to converge the beam from the source 1; a stop 3 defining an aperture through which the beam passes for shaping so as to have a transverse profile substantially the same as the desired profile of each subfield 6aa; a subfield-selection deflector 4, having a deflection center 4a, the subfield-selection deflector being operable to deflect the electron beam in the direction of a desired subfield 6aa on the reticle 6; and a second condenser lens 5 operable to bend the beam from the subfield selection deflector 4 so as to be parallel to the optical axis RX as the beam passes through the subfield 6aa.

Figure 2:
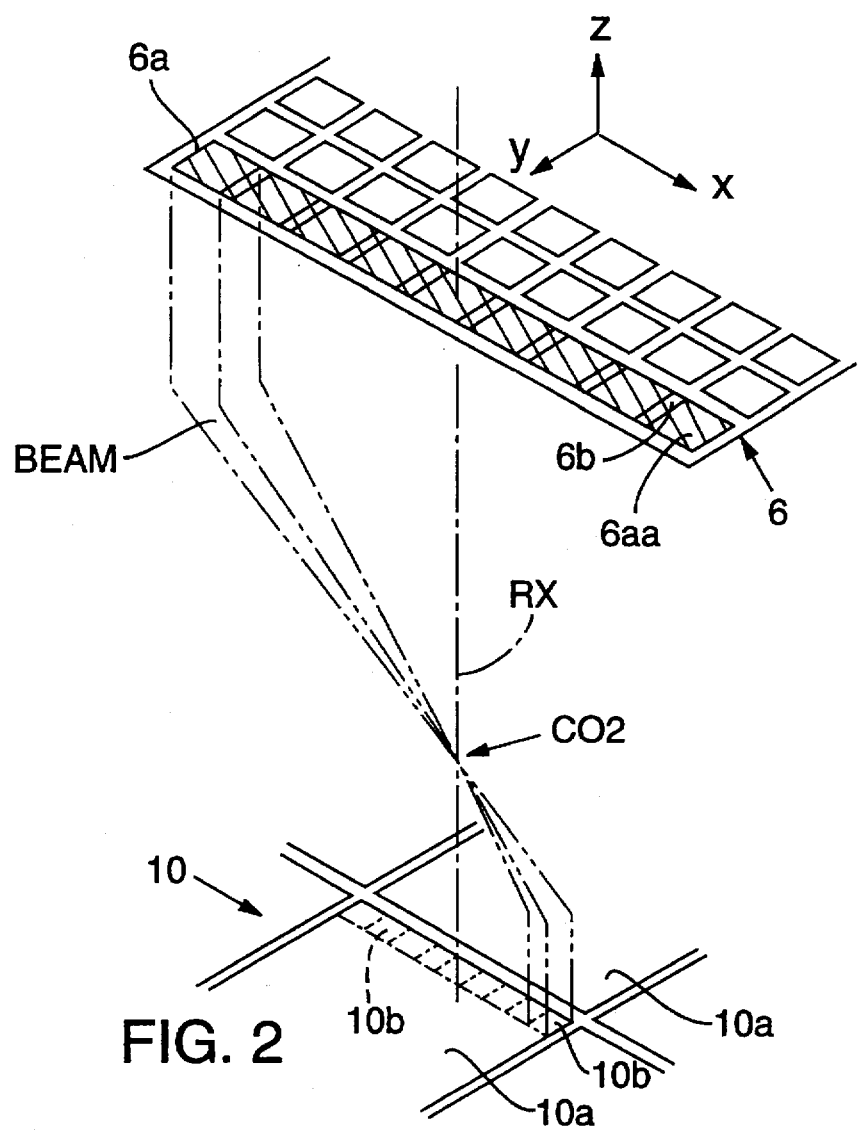
FIG. 2 is a schematic drawing showing a main field and subfields on a reticle used in a CPBTD according to the present invention.

Referring now to FIG. 2 (the diagram of FIG. 1 extends in the x–z plane indicated in FIG. 2), the overall pattern on the reticle 6 is divided into multiple main fields 6a (one such area is indicated by hatching). Each main field 6a is divided into multiple subfields 6aa arrayed in a column extending in the direction of the x axis. Boundaries 6b normally separate main fields and subfields from each other. The pattern in each subfield 6aa is respectively transferred to a corresponding region 10b on the substrate surface 10. The subfields 6aa are individually and sequentially transferred onto the substrate surface 10; after all the subfields 6aa of a main field 6a have been sequentially transferred, the next adjacent main field is transferred in the same manner, and so on until the entire pattern on the reticle 6 has been transferred to the substrate surface 10. The regions 10b on the substrate surface together reproduce the entire pattern that is defined by all the subfields on the reticle 6.

The FIG. 1 embodiment also comprises a first deflector 7, a projection lens 8, and a second deflector 9. Each of the first and second deflectors 7, 9 has a respective deflection center 7a, 9a, and the projection lens has a principal plane 8a. The first deflector 7 is operable to deflect the beam toward the optical axis RX and thus pass through the optical axis, or at least through the center, of the projection lens 8. The projection lens 8 forms the actual transfer image of each reticle subfield 6aa on the substrate surface 10. The second deflector 9 is operable to deflect the beam from the projection lens 8, preferably so that the beam is essentially parallel with the optical axis RX, as the beam impinges on the substrate surface 10.

After the beam has been shaped into the appropriate transverse profile by the stop 3, the beam is converged by the first condenser lens 2 at a first crossover CO1 located on the optical axis RX at the deflection center 4a of the subfield-selection deflector 4. The beam is deflected from the optical axis RX at an angle of $+\alpha$ by the subfield-selection deflector 4. (With reference to FIG. 1, if the beam is deflected counter-clockwise, its angle is positive, and if the beam is deflected clockwise, its angle is negative.) The beam is then deflected at an angle of $-\alpha$ by the second condenser lens 5 so as to be essentially parallel (it need not be precisely parallel) with the optical axis RX. The beam thus is incident on the subfield 6aa on the reticle 6. The stop 3 and reticle 6 preferably are optically conjugate with each other, and the size of the aperture defined by the stop 3 is usually that of a subfield 6aa.

After passing through the subfield 6aa, the beam is deflected by the first deflector 7 at an angle of $-\beta$ toward the optical axis RX so as to form a second crossover CO2 on the axis RX at the principal plane 8a of the projection lens 8. Thus, the first deflector 7 causes the beam to pass through the optical axis, or at least through the center, of the projection lens 8.

The axial distance L1 between the principal plane 8a and the deflection center 7a of the first deflector 7, and the axial distance L2 between the principal plane 8a and the deflection center 9a of the second deflector 9, satisfy the following expression:

$$L1/L2=M \tag{4}$$

wherein 1/M is the reduction ratio of the projection lens.

The second deflector 9 bends the beam by the angle $+\beta$ suitable for the beam to impinge on the substrate surface 10 substantially parallel to the optical axis RX. The beam is incident on the substrate surface 10 substantially perpendicular to the substrate surface at a region corresponding to the respective subfield 6aa on the reticle 6.

Preferably, the deflection sensitivity of the second deflector 9 is adjusted so that the distances $\delta 1$, $\delta 2$ between the beam and the optical axis RX satisfy the relation:

$$\delta 1/\delta 2=M$$

In the FIG. 1 embodiment, since the beam passing through the subfield 6aa is deflected by the first deflector 7 so as to cause the beam to pass through the optical axis, or at least through the center, of the projection lens 8, the corresponding transfer image of the subfield on the substrate surface is formed with minimal lens aberration, including minimal field curvature and astigmatism. In addition, the aperture of the projection lens 8 can be made small; thus, the FIG. 1 embodiment can be made small and low in mass compared to prior-art CPBTDs. Furthermore, since the beam-deflecting angles achieved by the first deflector 7 and the second deflector 9 are equal but opposite, any deflection aberrations individually generated by the first and second deflectors 7, 9, respectively, essentially cancel each other, thereby eliminating any adverse effects on the transfer image that would otherwise be caused by deflection aberrations.

Whereas the FIG. 1 embodiment preferably uses an electron beam as the charged-particle beam, it will be understood that an ion beam, for example, can alternatively be used. Since the mass of an ion is greater than the mass of an electron, it is preferable to use electrostatic lenses and deflectors, as the projection lens 8 and the deflectors 7, 9 for deflecting and focusing an ion beam; the deflecting and focusing effect of such lenses and deflectors on charged particles is greater than that of electromagnetic lenses.

Preferably, any effects of deflection aberration on the transfer image are further reduced by adhering to the following relationship regarding the inside diameter D7 and axial length L7 of the first deflector 7, and the inside diameter D9 and axial length L9 of the second deflector 9:

$$D7/D9=M \tag{5}$$

or $$L7/L9=M \tag{6}$$

Referring further to the FIG. 1 embodiment, the projection lens 8 is preferably a one-stage lens, and the second crossover CO2 is preferably situated where the principal plane 8a of the projection lens 8 crosses the optical axis RX.

Figures 3A, 3B:
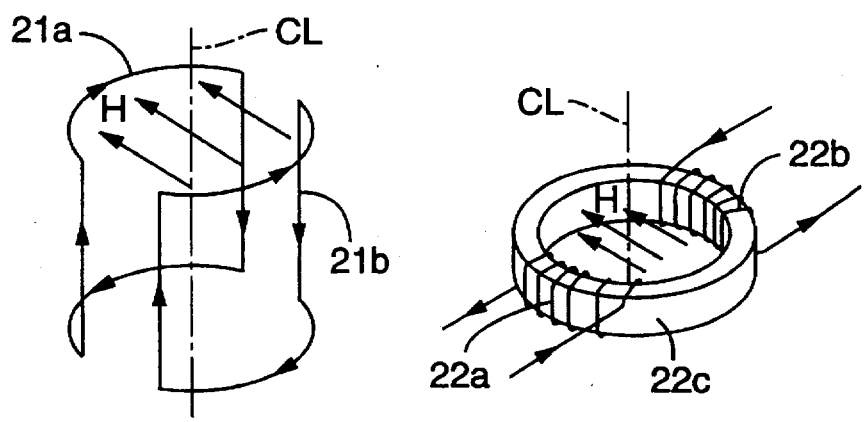
FIGS. 3A and 3B illustrate representative schemes by which electrical windings are made in saddle-type (FIG. 3A) and toroidal (FIG. 3B) electromagnetic deflectors as used in a CPBTD according to the present invention.

The first and second electromagnetic deflectors 7, 9 used in the FIG. 1 embodiment can be, for example, saddle-type or toroidal electromagnetic deflectors, or multi-pole electrostatic deflectors (preferably having at least six electrodes). FIG. 3A obliquely illustrates a representative scheme for a saddle-type electromagnetic deflector, and FIG. 3B obliquely illustrates a representative scheme for a toroidal electromagnetic deflector. In FIG. 3A, the deflection coils 21a, 21b are wound so as to describe a pair of warped planes that are symmetric around the centerline CL of the deflector; a magnetic field H is generated in the direction perpendicular to the center line CL by electrical currents traveling in the directions shown by the arrows. In FIG. 3B, the deflection coils 22a, 22b are wound on a cylindrical core 22c so as to be symmetrical around the centerline CL of the core. A magnetic field H is generated in the direction perpendicular to the centerline CL by electrical currents traveling in the directions shown by the arrows.

Figure 4:
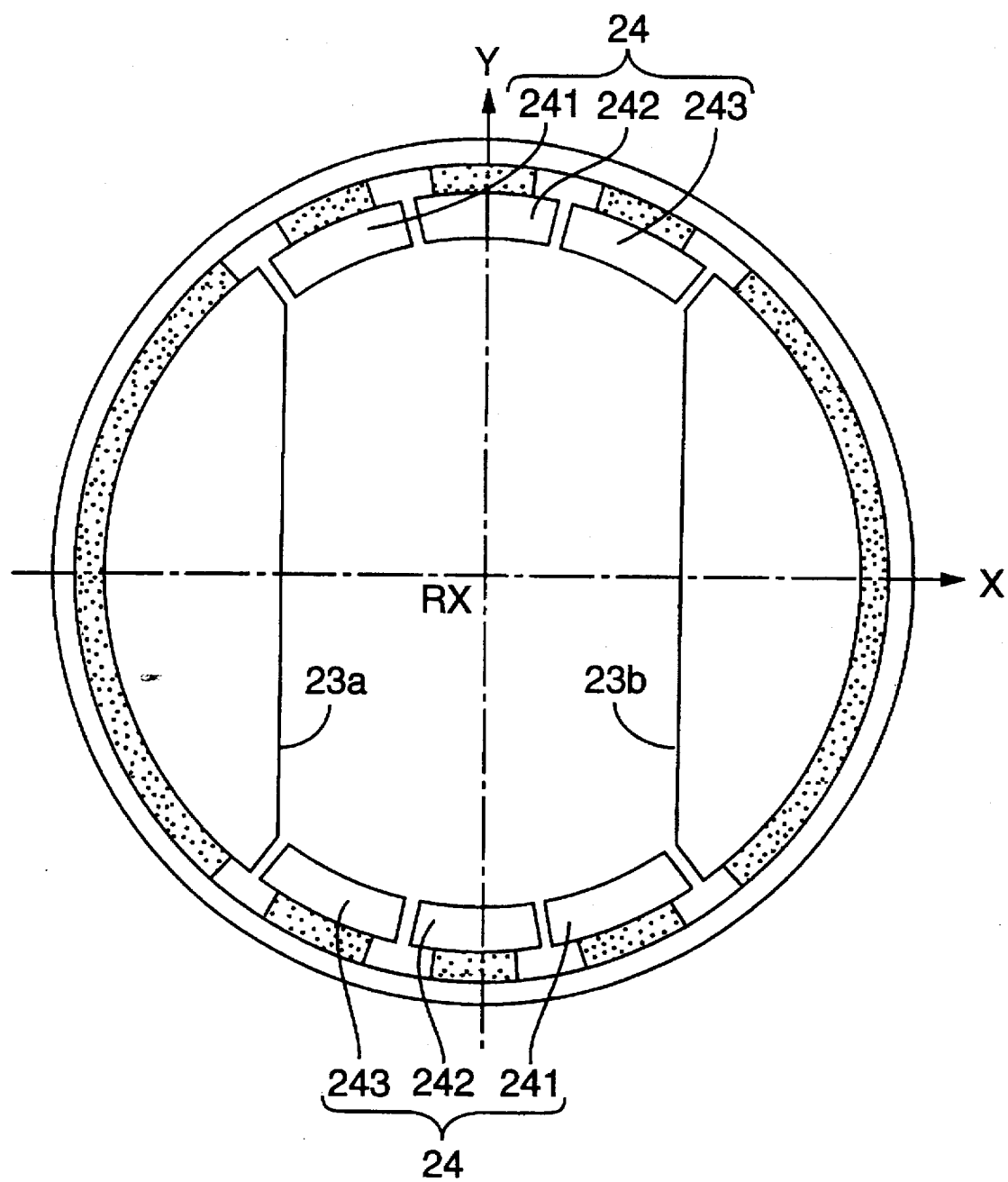
FIG. 4 is a transverse section of a multi-pole electrostatic deflector as used in a CPBTD according to the present invention.

FIG. 4 depicts a transverse (relative to the optical axis RX) cross section of a representative multi-pole electrostatic deflector. An electrical field is generated in the direction of the x axis between a positive electrode 23b and negative electrode 23a. Spreading of the electrical field away from being parallel with the x axis can occur at the upper and lower edges of the electrodes 23a, 23b. Hence, supplementary positive electrodes 24, comprising electrodes 241, 242, 243, are preferably situated as shown to cause the electrical field to be parallel with the x axis in these areas as well. Such a configuration minimizes any distortion of the transfer image caused by deflection of the beam, even if the electron beam passes through an area away from the optical axis RX. The electrodes 241, 242, 243 can be reduced to two electrodes.

Figure 5:
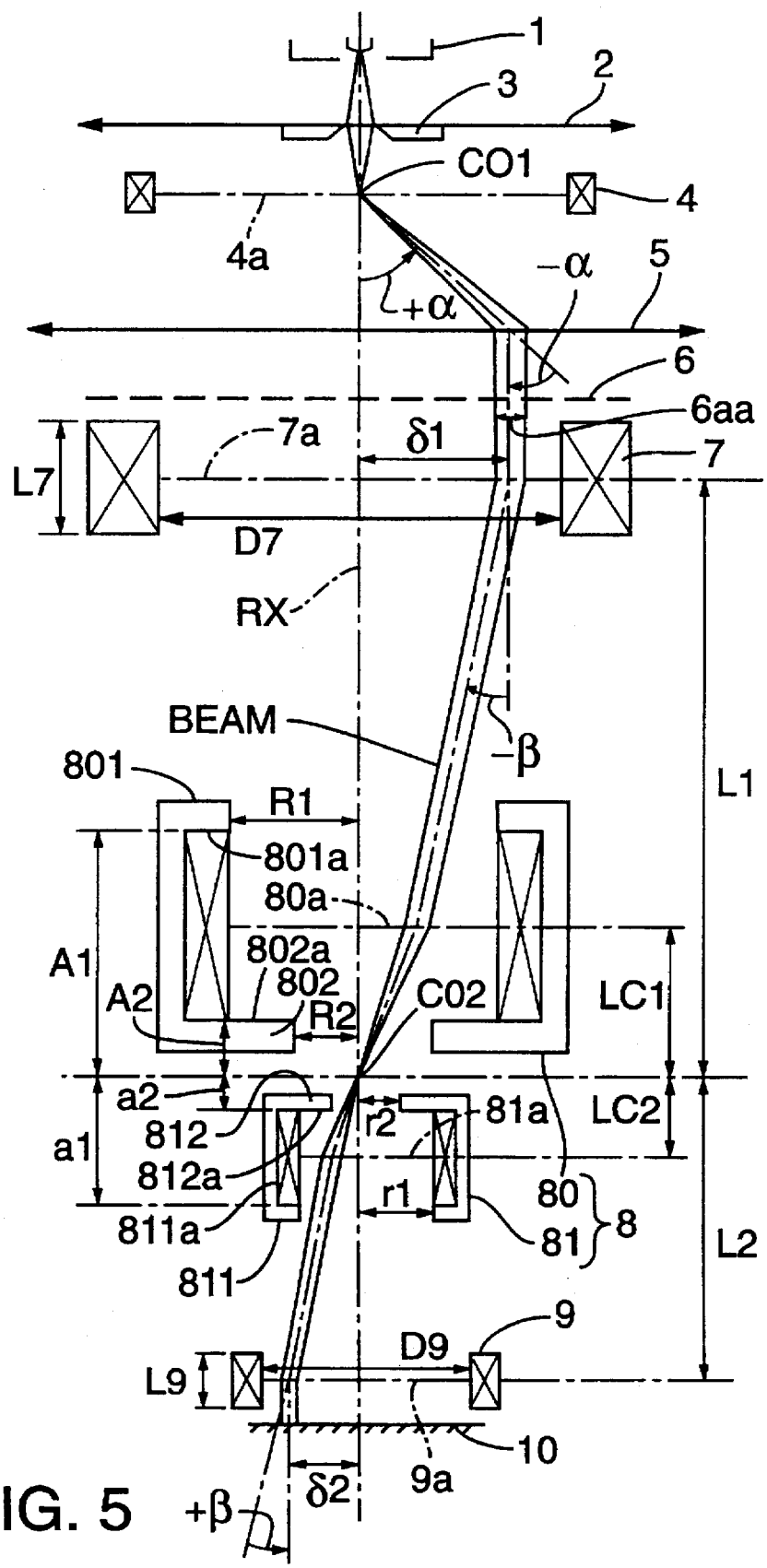
FIG. 5 is an optical diagram depicting certain features of a second example embodiment of a CPBTD according to the present invention.
Figure 6:
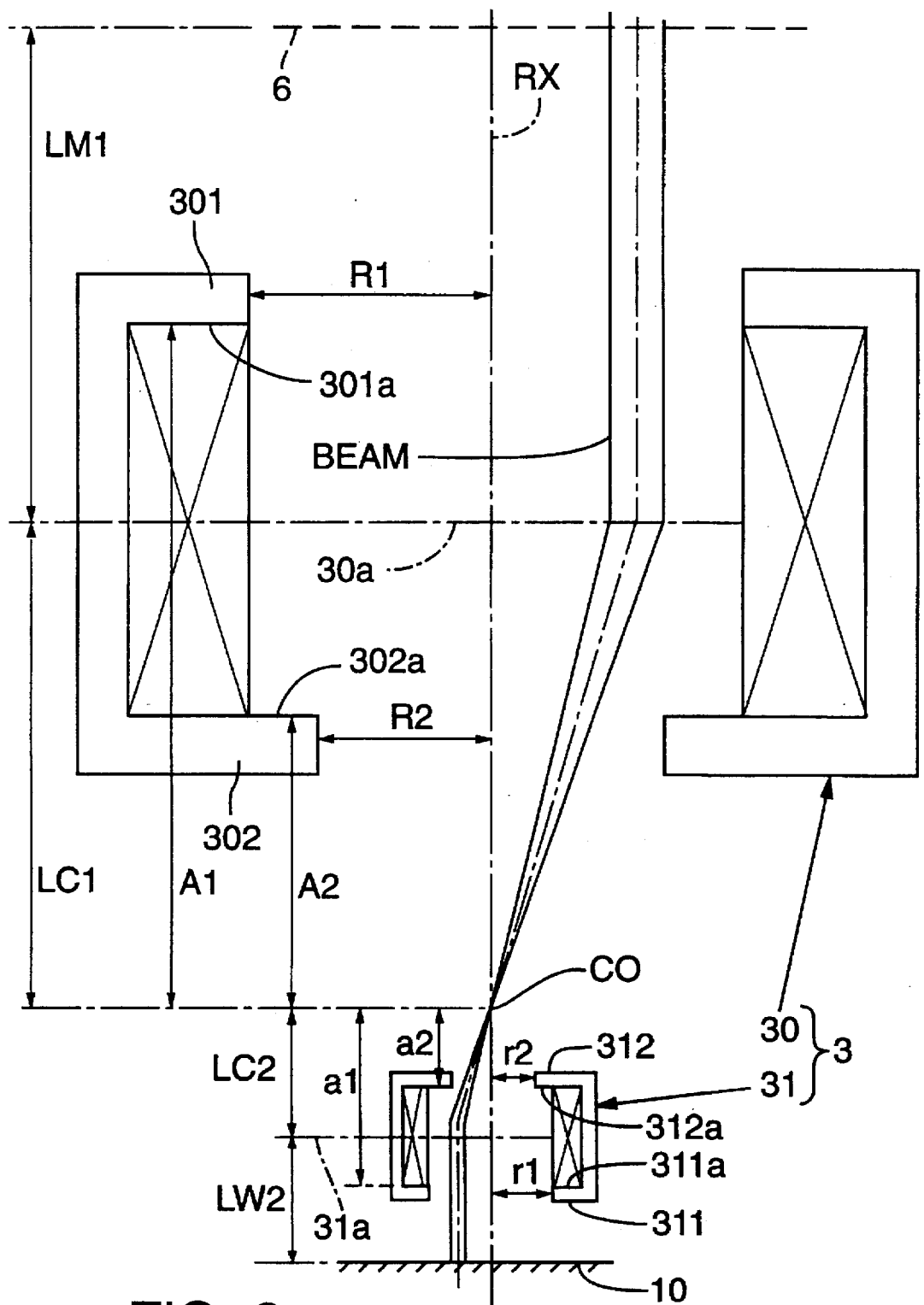
FIG. 6 is an optical diagram depicting certain features of a symmetrical magnetic doublet-type CPBTD as found in the prior art.

A second representative embodiment of a CPBTD according to the present invention is shown in FIG. 5. In FIG. 5, components that are the same as in FIG. 1 have the same reference designators. In the FIG. 5 embodiment, the projection lens 8 comprises a two-stage lens 80, 81. A second crossover CO2 is situated between the lenses 80, 81 at a point on the optical axis RX that subdivides the distance between the reticle and the substrate surface into M:1, where 1/M (1≦M<20) is the reduction ratio of the CPBTD.

Referring further to FIG. 5, the lens 80 comprises magnetic poles 801, 802 having bore radii R1, R2, respectively. The magnetic pole 801 has a crossover-side face 801a, and the magnetic pole 802 has a reticle-side face 802a. The axial distance between the second crossover CO2 and the crossover-side face 801a is A1, and the axial distance between the second crossover CO2 and the reticle-side face 802a is A2. Similarly, the lens 81 comprises magnetic poles 811, 812 having bore radii r1, r2, respectively. The magnetic pole 811 has a crossover-side face 811a, and the magnetic pole 812 has a substrate-side face 812a. The axial distance between the second crossover CO2 and the crossover-side face 811a is a1, and the axial distance between the second crossover CO2 and the substrate-side face 812a is a2. Each of the lenses 80, 81 also has a principal plane 80a, 81a, respectively, wherein LC1 is an axial distance between the principal plane 80a and the second crossover CO2, and LC2 is the axial distance between the principal plane 81a and the second crossover CO2. The ampere-turn (AT) of each of the lenses 80, 81 is equal, and the orientation of the respective magnetic field formed by each lens is opposite to the other.

With respect to the lenses 80, 81, the following expressions are preferably satisfied:

$$LC1/LC2=M \quad (7)$$

$$R1/r1=R2/r2=M \quad (8)$$

$$A1/a1=A2/a2=M \quad (9)$$

Further with respect to the FIG. 5 embodiment, expression (4) is preferably satisfied:

$$L1/L2=M \quad (4)$$

wherein 1/M is the reduction ratio of the projection lens, L1 is the axial distance between the second crossover CO2 and the deflection center 7a of the first deflector 7, and the L2 is the axial distance between the second crossover CO2 and the deflection center 9a of the second deflector 9.

The following expressions are also preferably satisfied with respect to the first deflector 7 and second deflector 9 in the FIG. 5 embodiment:

$$D7/D9=L7/L9=M \quad (10)$$

wherein D7 and D9, and L7 and L9 are the inside diameters and lengths along the optical axis RX, respectively, of the first and second deflectors 7, 9, respectively.

In addition, where δ1 is the radial distance from the optical axis RX to the axis of the beam passing through the first deflector 7, and δ2 is the radial distance from the optical axis RX to the axis of the beam passing through the second deflector 9, the following expression is preferably satisfied:

$$\delta1=M\delta2$$

Further with respect to the FIG. 5 embodiment, the beam propagating from the source 1 (such as an electron gun) is formed by the first and second condenser lenses 2, 5 and the aperture stop 3 into a beam that is parallel with itself and with the optical axis RX. The substantially parallel beam then enters a subfield 6aa on the reticle 6. The beam is then deflected by the first deflector 7 at an angle -β toward the optical axis RX, is converged by the lens 80, and passes through the second crossover CO2. The deflection angle (-β) imposed on the beam by the first deflector 7 allows the beam, after having passed through the lens 80, to pass through the second crossover CO2. The beam then passes through the lens 81, is deflected by the second deflector 9 at an angle +β, and impinges upon the substrate surface 10 substantially perpendicular to the substrate surface.

Whenever the beam passes through a reticle subfield that is transversely displaced a long distance from the optical axis, the beam path length from the reticle to the substrate surface is longer than when the beam passes through a reticle subfield that is closer to the optical axis. Since such a change in path length could cause a shift in focus, the electrical currents used to excite the lenses 80, 81 are adjusted to compensate and thus keep the focus the same for all subfields.

In the FIG. 5 embodiment, the beam that has passed through the reticle 6 is deflected by the first deflector 7 toward the optical axis RX; as a result, the beam passes through the optical axis, or at least through the center, of each of the lenses 80, 81, which minimizes lens aberrations, including field curvature and astigmatism. Lens aberrations are further reduced in this embodiment because the projection lens 8 preferably satisfies all the symmetric magnetic doublet expressions except the condition in which the principal plane 80a of the lens 80 is situated half-way between the reticle 6 and the second crossover CO2 and the principal plane 81a of the lens 81 is situated half-way between the substrate surface 10 and the second crossover CO2.

In addition, since the beam-deflecting directions of the deflectors 7 and 9 are opposite relative to each other in the FIG. 5 embodiment, similar cancellations of aberrations as obtained with the FIG. 1 embodiment can be realized with the FIG. 5 embodiment. Furthermore, since the projection lens 8 has two stages, and since the first and second deflectors 7, 9 collectively represent a two-stage configuration, any aberrations arising in the first of such stages are canceled by corresponding aberrations arising in the second of such stages. (I.e., aberrations arising in the first lens 80 are cancelled by aberrations arising in the second lens 81, and aberrations arising in the first deflector 7 are cancelled by aberrations arising in the second deflector 9.) This allows the aberrations to be separately handled, thus simplifying the design of the optical system.

Therefore, in apparatus according to the present invention, the charged particle beam is deflected by the first deflector so that it passes through the optical axis, or at least in the center, of the projection lens, regardless of which subfield on the reticle the beam has passed through. Consequently, the effects of lens aberrations on the transfer image can be decreased. Also, since deflection aberrations generated by the first and second deflectors cancel each other, the effects of deflection aberrations on the transfer image are suppressed. These benefits allow larger fields to be transferred than with past transfer devices, thereby allowing greater throughput. Furthermore, the beam semiangle of the projection lens can be made larger, allowing any beam blur due to the space-charge effect to be decreased.

Since aberrations generated by the first-stage lens are canceled by aberrations generated by the second-stage lens, and since aberrations generated by the first-stage deflector are canceled by the aberrations generated by the second-stage deflector, these respective aberrations can be separately handled, simplifying the design of the optical system.

Whereas the present invention has been described in connection with several example embodiments, it will be understood that the invention is not limited to those embodiments. The example embodiments merely illustrate the best mode now known for practicing the invention. The invention is intended to cover all alternatives, modifications, and equivalents as may be included within the spirit and scope of the invention as defined by the appended claims.

What is claimed is:

1. A charged particle beam transfer device for transferring a pattern defined by a reticle onto a substrate surface, the device comprising on an optical axis:

(a) a projection lens operable to focus a particle beam, after the beam has passed through a subfield of a reticle, onto a substrate surface;

(b) a first deflector operable to deflect the charged particle beam relative to the optical axis, after the beam has passed through the subfield of the reticle, to cause the beam to pass at least in the center of the projection lens as the beam propagates toward the substrate surface; and (c) a second deflector situated between the projection lens and the substrate surface, the second deflector being operable to deflect the charged particle beam relative to the optical axis, after the beam has passed at least in the center of the projection lens, to direct the beam to a region on the substrate surface corresponding to the subfield.

2. The charged particle beam transfer device of claim 1, wherein the first deflector is operable to cause the charged particle beam to pass through the optical axis at a crossover as the beam propagates to the second deflector.

3. The charged particle beam transfer device of claim 2, wherein:

the projection lens is a one-stage lens having a principal plane; and the crossover is situated at the principal plane of the projection lens.

4. The charged particle beam transfer device of claim 3, wherein:

the projection lens exhibits a reduction ratio of 1/M; and the first deflector has a deflection center situated a distance L1 from the principal plane of the projection lens, and the second deflector has a deflection center situated a distance L2 from the principal plane of the projection lens, the charged particle beam transfer device satisfying the relationship:

$L1/L2=M.$

5. The charged particle beam transfer device of claim 2, wherein:

the projection lens is a two-stage lens exhibiting a reduction ratio of 1/M; and the crossover is situated on the optical axis at a distance that subdivides the axial distance from the reticle and the substrate surface into M:1.

6. The charged particle beam transfer device of claim 5, wherein the projection lens comprises a reticle-side electromagnetic lens element and a substrate-side electromagnetic lens element, the reticle-side electromagnetic lens element comprising a reticle-side magnetic pole having a bore radius R1 and a substrate-side magnetic pole having a bore radius R2, and the substrate-side electromagnetic lens element comprising a reticle-side magnetic pole having a bore radius r1 and a substrate-side magnetic pole having a bore radius r2, the charged particle beam transfer device satisfying at least one of the relationships:

$R1/r1=M$ and $R2/r2=M.$

7. The charged particle beam transfer device of claim 5, wherein the projection lens comprises a reticle-side electromagnetic lens and a substrate-side electromagnetic lens, the reticle-side electromagnetic lens and the substrate-side electromagnetic lens having equal ampere-turn numbers but each electromagnetic lens forming a magnetic field having an opposite orientation to the magnetic field formed by the other electromagnetic lens.

8. The charged particle beam transfer device of claim 1, wherein the charged particle beam is an electron beam, and the projection lens is an electromagnetic lens.

9. The charged particle beam transfer device of claim 1, wherein the charged particle beam is an ion beam, and the first and second deflectors are electrostatic deflectors.

10. The charged particle beam transfer device of claim 1, wherein each of the first and second deflectors is a multipole electrostatic deflector.

11. The charged particle beam transfer device of claim 1, wherein the projection lens exhibits a reduction ratio of 1/M, the first deflector has an inside diameter D7 and an axial length L7, and the second deflector has an inside diameter D9 and an axial length L9, the charged particle beam transfer device satisfying at least one of the following relationships:

$D7/D9=M$ $L7/L9=M.$

12. The charged particle beam transfer device of claim 11, wherein the first and second deflectors are independently selected from a group consisting of toroidal electromagnetic deflectors and saddle-type electromagnetic deflectors.

13. A charged particle beam transfer device for transferring a pattern defined by a reticle onto a substrate surface, the device comprising on an optical axis:

(a) a condenser lens for directing a charged particle beam to be incident, essentially perpendicularly to the optical axis, on a subfield of a reticle;

(b) a projection lens for directing the particle beam, after the beam has passed through the subfield, to pass through a crossover on the optical axis and focus the beam on a region of the substrate surface;

(c) a first deflector situated between the condenser lens and the projection lens, the first deflector being operable to deflect the charged particle beam, after the beam has passed through the subfield, by a first angle relative to the optical axis to cause the beam to pass at least through the center of the projection lens; and (d) a second deflector operable to deflect the charged particle beam, after the beam has passed through the projection lens, to direct the beam to be incident, essentially perpendicularly to the optical axis, on a region on the substrate surface corresponding to the subfield.

14. A charged particle beam transfer device for transferring a pattern defined by a reticle onto a substrate surface, the device comprising on an optical axis:

(a) a charged particle beam source;

(b) a condenser lens for focusing the charged particle beam onto a subfield of a reticle;

(c) a projection lens for focusing the particle beam, after the beam has passed through the subfield, onto the substrate surface;

(d) a first deflector situated between the condenser lens and the projection lens, the first deflector being operable to deflect the charged particle beam, after the beam has passed through the subfield, by a first angle relative to the optical axis so that the beam passes through at least the center of the projection lens; and (e) a second deflector operable to deflect the charged particle beam, after the beam has passed through the projection lens, by a second angle equal to but opposite the first angle to direct the beam to a region on the substrate surface corresponding to the subfield.

15. The charged particle beam transfer device of claim 14, wherein the charged particle beam source is operable to produce an electron beam.

16. The charged particle beam transfer device of claim 15, wherein the first and second deflectors are electromagnetic deflectors.

17. The charged particle beam transfer device of claim 14, wherein the charged particle beam source is operable to produce an ion beam.

18. The charged particle beams transfer device of claim 17, wherein the first and second deflectors are electrostatic multi-pole deflectors each comprising at least six electrodes.

19. The charged particle beam transfer device of claim 18, wherein the first and second deflectors each comprise two larger parallel electrodes each flanked on both sides by at least two smaller parallel electrodes.

20. The charged particle beam transfer device of claim 14, further comprising a subfield selection deflector situated between the charged particle beam source and the reticle, the subfield selection deflector being operable to deflect the particle beam appropriately to be incident on the subfield.

* * * * *